United States Patent
Gados et al.

(10) Patent No.: US 6,814,808 B1
(45) Date of Patent: Nov. 9, 2004

(54) CARRIER FOR SEMICONDUCTOR WAFERS

(75) Inventors: Glenn A. Gados, Camarillo, CA (US); Matthew Coe, Simi Valley, CA (US)

(73) Assignee: Sci-Tech Glassblowing, Inc., Moorpark, CA (US)

( * ) Notice: Subject to any disclaimer, the term of this patent is extended or adjusted under 35 U.S.C. 154(b) by 0 days.

(21) Appl. No.: 10/265,882

(22) Filed: Oct. 8, 2002

(51) Int. Cl.⁷ .............................................. B05C 13/02
(52) U.S. Cl. ..................... 118/500; 118/728; 269/903
(58) Field of Search .................................. 118/500, 728, 118/52; 204/298.15; 269/903; 134/902; 414/937, 938, 940; 211/41.18; 206/511, 564, 832

(56) References Cited

U.S. PATENT DOCUMENTS

| | | |
|---|---|---|
| 765,674 A | 7/1904 | Normandin |
| 3,534,862 A | 10/1970 | Shambelan |
| 3,701,558 A | 10/1972 | Baker |
| 3,828,726 A | 8/1974 | Dietze et al. |
| 3,861,733 A | 1/1975 | Vander Mey |
| 3,939,973 A | 2/1976 | Wallestad |
| 4,256,229 A | 3/1981 | Lee |
| 4,412,812 A | 11/1983 | Sadowski et al. |
| 4,439,146 A | 3/1984 | Sugita |
| 4,484,538 A | 11/1984 | Sarkozy et al. |
| 4,515,104 A | 5/1985 | Lee |
| 4,572,101 A | 2/1986 | Lee |
| 4,687,097 A * | 8/1987 | Mortensen ............... 211/41.18 |
| 4,841,906 A | 6/1989 | deGeest, Jr. |
| 4,872,554 A | 10/1989 | Quernemoen |
| 5,033,406 A | 7/1991 | Lee |
| 5,417,767 A | 5/1995 | Stinson |
| 5,468,297 A | 11/1995 | Letort |
| D381,344 S | 7/1997 | Kosaku |
| 5,788,304 A | 8/1998 | Korn et al. |
| 6,089,377 A | 7/2000 | Shimizu |
| 6,095,806 A | 8/2000 | Suzuki et al. |
| 6,099,302 A | 8/2000 | Hong et al. |
| 6,287,112 B1 | 9/2001 | Van Voorst Vader |
| 6,341,935 B1 | 1/2002 | Tseng |

FOREIGN PATENT DOCUMENTS

| | | |
|---|---|---|
| JP | 134553 | 10/1979 |
| WO | WO 00/38222 | 6/2000 |

* cited by examiner

Primary Examiner—Christopher A. Fiorilla
Assistant Examiner—Yewebdar Tadesse
(74) Attorney, Agent, or Firm—Robert Louis Finkel

(57) ABSTRACT

A quartz carrier having spaced, parallel grooved rods for holding a batch of semi-conductor wafers edgewise in upstanding, spaced, parallel relation is formed with a pair of flat end plates supporting the ends of the rods. The ends of the end plates extend laterally outwardly of the rods and support a pair of inverted "U"-shaped carrier support members extending along the length of the carrier. A tool having an carrier engaging rod mounted to a handle allows the user to insert the carrier engaging rod into one of the carrier support members to support the weight of the carrier. A rod mounted to the handle extends beyond the length of the wafer supporting grooved rods and engages the ends of the end plates to limit the rotation of the carrier about the carrier support member, enabling the user to raise and manipulate the carrier by means of the handle.

12 Claims, 3 Drawing Sheets

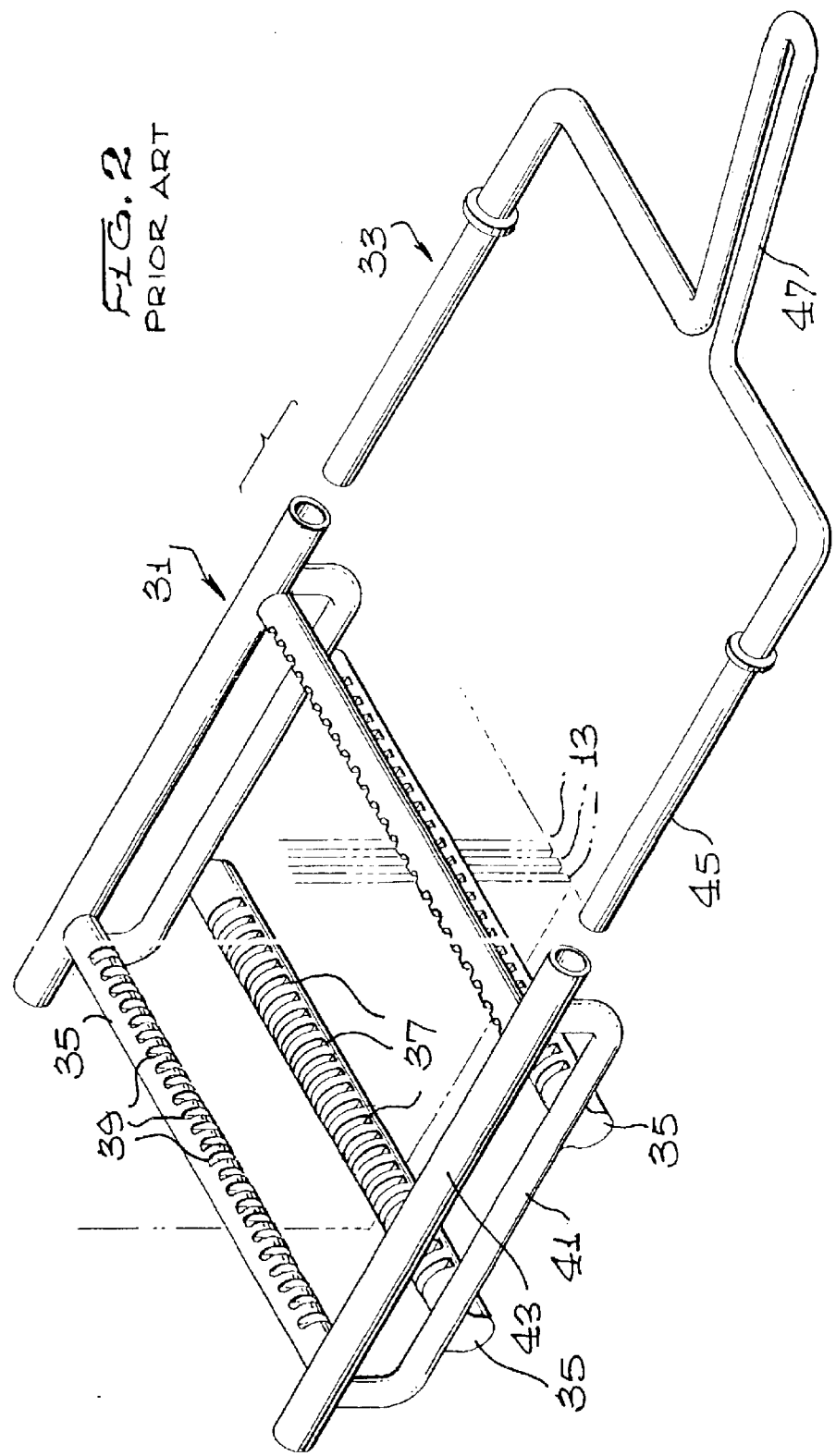

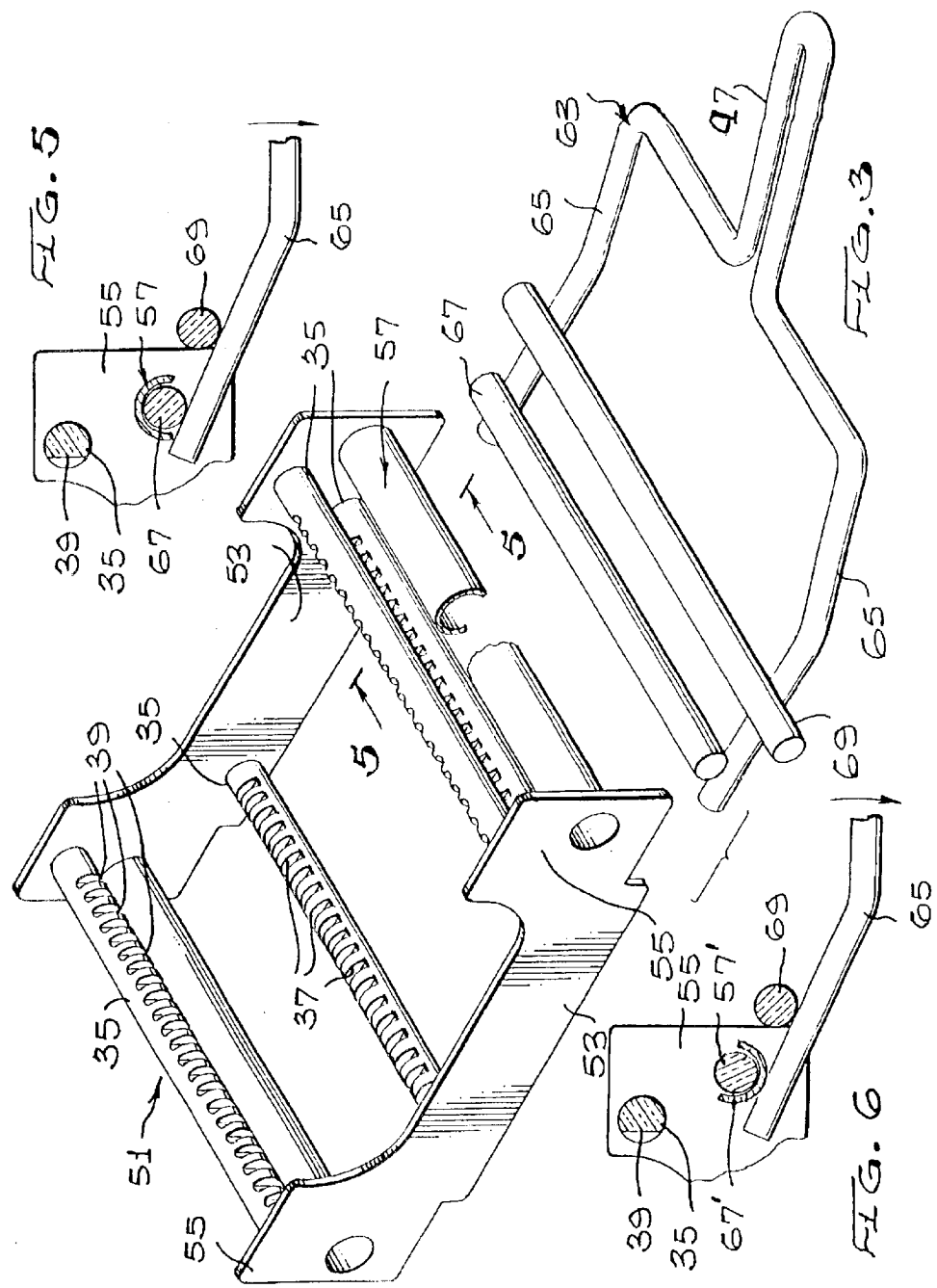

CARRIER FOR SEMICONDUCTOR WAFERS

BACKGROUND OF THE INVENTION

1. Field of the Invention

The subject invention relates to carriers for holding and transporting silicon wafers or the like in the production of semiconductor devices.

2. Prior Art

The mass-production of semiconductor devices involves a series of steps by means of which an electrical circuit in the form of a thin layer of conductive material is applied to the surface of microns-thick wafers of silicon or other suitable materials. During the fabrication process, batches of wafers are transported between processing stations, and processed, in open baskets or carriers commonly referred to as "boats." Conventionally, these carriers are sized to hold 25, 35, or 50 wafers. In some instances, the carriers are loaded and unloaded manually. More commonly, however, the wafers are inserted and removed by automatic mass transfer devices employing robotic arms and multi-pin elevator systems for manipulating some or all of the wafers in a carrier in a single operation or sequence of steps.

For most processing operations, the carriers may be made of Teflon®, polypropylene, various metals, polysilicon, silicon carbide, or other convenient materials. Some of the processing steps are carried out at very high temperatures, however, and to withstand these temperatures and avoid contamination, the carriers used are commonly made of nearly pure quartz.

Typically, a prior art quartz carrier comprises a plurality of parallel quartz rods having a series of transverse grooves or slots spaced lengthwise. Quartz cross members welded to the ends of the rods define a rigid, open basket adapted to receive and support a batch of wafers upstanding edgewise in spaced, parallel relation. FIG. 2 illustrates one such prior art carrier.

To facilitate the creation and implementation of industry-wide manufacturing practices and quality control procedures, industrial standards have been adopted regulating the configuration, construction, and specifications of these carriers. Pursuant to those standards, in a carrier adapted to retain 25 wafers, the grooves in the supporting rods are to be positioned 0.1875 inches, plus or minus 0.002 inches, on-center. For 35 wafers, the grooves are 0.1475 inch, plus or minus 0.002 inch, on-center, and for 50 wafers, 0.0937 inch, plus or minus 0.002 inch on-center.

For certain of the steps in the production process requiring exposure of the wafers to high temperatures, it is conventional to load a number of carriers with their batched wafers onto a supporting structure of some sort by means of which the wafer-bearing carriers are transported through the heat-treating chamber of a diffusion furnace. In one prior art system, the carriers are mounted to an elongated sled or wheeled cart and pass through the heating chamber in a single file. This arrangement proved undesirable for a number of reasons. Primary among these is that the wafers in the train of carriers are processed sequentially and are thus subject to variations in temperature and ambient operating conditions.

A preferred form of transport system and the one presently in common use is illustrated in FIG. 1. As shown, the supporting transport structure is an elongated "paddle," commonly fabricated of silicon carbide or another suitable material, cantilevered from a motorized track. In this arrangement, the carriers pass through the hot region of the furnace in a transverse line perpendicular to the direction of motion. Advantageously, the wafers in all of the carriers are processed at the same time, at the same temperature, and under substantially the same ambient conditions. Additionally, since the wafers are moving through the furnace edgewise, their passage through the chamber has little eddy-generating affect on the chamber atmosphere. The relative air flows smoothly through the spaces between adjacent wafers and across (i.e., parallel to), rather than against the wafers' surfaces.

By virtue of these advantages, the use of this system imposes several requirements on the construction, configuration, and operation of the wafer carriers. One of these is to maximize the number of wafers that can be loaded into the allotted space on the paddle. Another is to provide manual means for conveniently and safely loading, unloading, and manipulating individual carriers without damaging or disturbing their wafer cargo.

Addressing the first of these requirements, as will be apparent, the cross members at the ends of the prior art carriers exemplified in FIG. 2 occupy a substantial amount of furnace space that might otherwise be utilized for processing additional wafers. U.S. Pat. No. 4,515,104 represents an attempt to minimize the space taken up by the rod-supporting cross members and thereby maximize the capacity carriers capacity. Its approach is to space the cross members inwardly of the ends of the rods. While in principle this arrangement allows adjacent carriers to be positioned in contiguous end-to-end relationship, carriers embodying the construction suffer from certain serious deficiencies. For one, the end-most wafers, lacking frontal protection, are subject to being displaced or jarred out of position and to contacting one another. For another, the cross members, being positioned within the wafer-containing portion of the carrier, prevent or severely limit the use of most mass transfer devices for the automated loading and unloading of wafers. For still another, the cross members deflect the flow of gases within the carrier and create vortices and eddies in the spaces between the adjacent wafers that subject the wafers to uneven heating and exposure.

Clearly, there is a need for, and one of the objectives of the subject invention is the provision of a carrier that affords the maximum wafer-loading capacity without the deficiencies inherent in the known prior art carriers.

With respect to the second requirement, a number of devices have been designed for manually handling quartz carriers. Generally, these fall into two categories: One of these employs receptacles mounted to the carrier, either axially or transversely, and a split or forked handle having hooks or tines adapted for insertion into the receptacles. Examples of these devices are shown and described in U.S. Pat. Nos. 3,861,733, and 4,515,104. Suffice to say these devices suffer from a number of widely recognized inherent deficiencies, such as, fragility, difficulty of alignment, instability, susceptibility to slippage and uncontrolled release, and in the case of the axially-mounted handle, lack of random accessibility to the carriers, that render them less than satisfactory.

The second category of manipulating devices employs a tool assembly adapted to serve two functions, the first, supporting the weight of the carrier, and the second, limiting the rotational motion of the carrier about the weight-supporting means. These devices are illustrated by U.S. Pat. Nos. 4,572,101, and 5,033,406. Assemblies of this type are generally side mounted and have the principal advantage of affording the user random access to individual carriers in a string. The price of the advantage, however, is the substantial cost, the weight penalty, and the increased fragility associated with the auxiliary mounting structures required for attachment of the tool to the carrier. A viable alternative is needed, and accordingly, another object of the subject invention is the provision of a side-mounted tool assembly for manipulating the carrier safely and efficiently that avoids the deficiencies of the known prior art assemblies.

BRIEF SUMMARY OF THE INVENTION

The subject invention utilizes a pair of thin, substantially flat quartz end pieces in place of the conventional ⅜" or ⅝" rod or tubular cross members employed in the prior art carriers to join the wafer supporting rods and stiffen the carrier structure. Not more than ⅛ inch thick, these end pieces afford a saving of almost an inch in the overall length of a carrier, providing space for as many as two additional carriers with their wafers in the typical furnace hot zone. This represents a potential increase of 30% in the yield at each stage of processing.

In addition to enhanced yield, the use of thin, flat end pieces affords the subject invention a second advantage in eliminating the need for excess structural components. Whereas all of the prior art side mounted handle assemblies require auxiliary support and motion limiting apparatus on the carrier or on the handle, or both, the subject invention employs only one support member and utilizes the end pieces to limit the rotation of the carrier.

A further advantage derived from the employment of the flat end pieces to support the axial rods is that a carrier made in accordance with the invention is fully adapted for use with all of the known automated-transfer systems presently in the field.

With this brief overview as background, other objects, features, advantages, and applications of the invention will become apparent from the following detailed description of the construction and operation of what is presently considered to be its preferred embodiment as illustrated in the accompanying drawings, wherein:

BRIEF DESCRIPTION

FIG. 2 is a top frontal perspective view of a typical prior art side lifting wafer carrier and tool assembly;

FIG. 3 is a top frontal perspective view of a side lifting wafer carrier and tool assembly embodying the subject invention;

FIG. 5 is a fragmentary sectional view of the wafer carrier of FIG. 3 taken in the direction, and in the vertical plane passing through the line designated 5—5; and FIG. 6 is a fragmentary sectional view of a alternative embodiment of the subject invention.

Wherever practicable, throughout the drawings like numerals are employed to designate like or functionally equivalent parts.

DETAILED DESCRIPTION

During the fabrication of semi-conductor devices, semi-conductor wafers are subjected to a variety of processing steps. Many of these steps, such as diffusion, oxidation, vapor deposition, annealing and the like, are carried out at very high temperatures in diffusion furnaces. For economy and convenience, it is common for batches of wafers to be loaded into quartz carriers or baskets for mass processing and transport.

Figure 1:
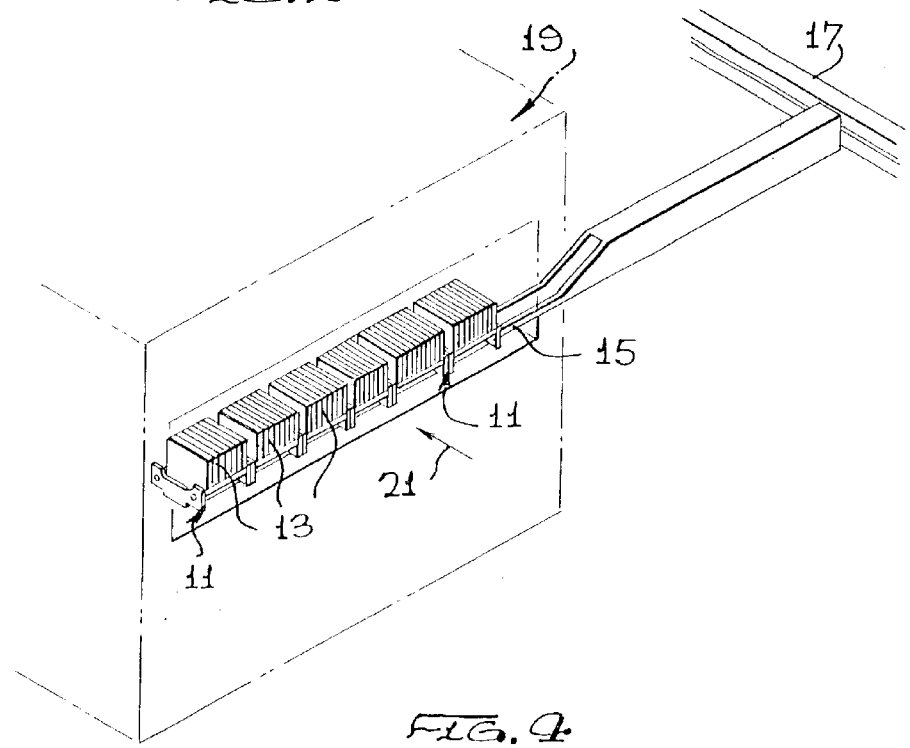
FIG. 1 is a fanciful, fragmentary, top frontal perspective view of a typical heat-treating diffusion furnace showing a carrier transporting paddle and a portion of the paddle drive track.

Referring to FIG. 1, commonly, groups of four to eight carriers 11 each containing from twenty-five to as many as fifty wafers 13 are placed end-to-end on an elongated silicon carbide paddle 15 mounted to a conventional automated drive mechanism 17. Well known sensing, monitoring, and control systems activate the drive mechanism 17 to propel paddle 15 with carriers 11 through furnace 19 in the direction indicated by arrow 21.

After each high-temperature procedure is completed, the carriers 11 are removed from the furnace and the wafers 13 in it allowed to cool. In some instances, a carrier 11 may be removed from the paddle and transported to another location for further treatment of its load of wafers 13. More commonly, the carrier is removed from paddle 15 and transported to an automated transfer machine (not shown), which removes selected individual or combinations of wafers 13 from the carrier 11 for further processing. During the transfer operation, wafers 13 may be unloaded from a first carrier 11, and in a series of steps transferred to and from a succession of carriers 11.

Typically, a loaded carrier is placed in a receiver on the transfer machine and lifters in the base of the machine are thrust upwardly through the open carrier framework to elevate individual wafers 13 in a predetermined sequence. Retainers positioned above the carrier 11 gasp and support the wafers 13 allowing the lifters to be retracted into the base, freeing the carrier 11 for removal and replacement with another carrier into which some or all of the suspended wafers are loaded in readiness for transport to the next processing station. The construction and function of the transfer mechanism mandate that all the wafers in the carrier be freely accessible to the lifters and that the carrier structure not interfere with the transfer operation.

FIG. 2 illustrates a typical prior art carrier 31 and a tool 33 adapted to allow a technician to lift and manipulate it in transit between processing sites. Conventionally, the carrier 31 is formed with two pairs of support members, such as horizontal quartz rods 35 having grooves 37 and slots 39 adapted to receive and support batches of wafers 13 edgewise in upstanding, parallel relation. The rods 35 are supported at their ends by a framework of quartz rods 41 and tubes 43. The tubes 43 are disposed substantially transverse to the length of the carrier 31 and are adapted to receive a pair of spaced tines 45 extending from a handle 47 formed on tool 33. The side-mounted tool 33 allows the technician selectively to engage and remove or replace individual carriers 31 from a string of carriers on a paddle without disturbing any of the other carriers 31 in the string.

This system is generally effective for its intended purpose, however, the thickness of the framing elements, rods 41 and tubes 43 at either end of the carrier 31 take up valuable space on the paddle 15, which might otherwise be better used for processing wafers 13. Carriers, such as those shown and described in earlier-mentioned U.S. Pat. No. 4,514,104, that are designed to obviate this problem by positioning the supporting rods 41 inwardly of the ends of the support members, rods 35, merely replace those problems with another set posing even greater deficiencies.

Figure 4:
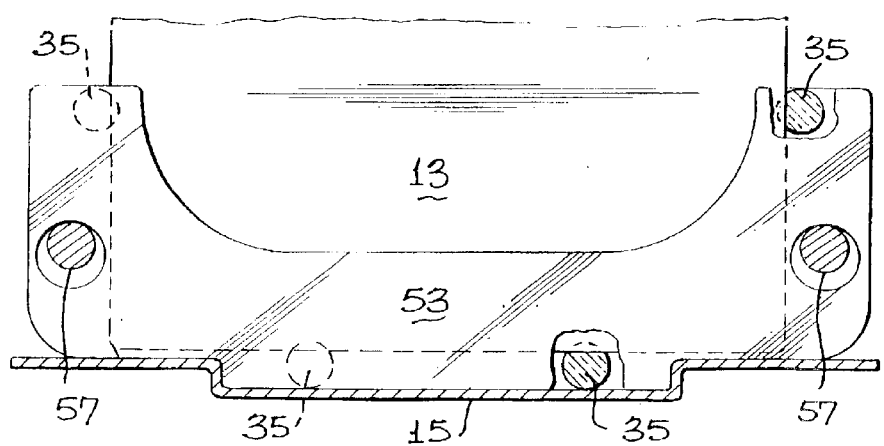
FIG. 4 is an enlarged fragmentary frontal elevation of a wafer carrier such as that shown in FIG. 3 positioned on a paddle such as that shown in FIG. 1.

FIGS. 3-5 illustrate the construction, configuration and operation of a carrier 51 representing the preferred embodiment of the subject invention.

As in the prior art carrier 31, the present carrier 51 employs mounting means, such as rods 35 having grooves 37 and slots 39 adapted to receive and support individual or batches of wafers 13. In place of the space-hogging rods 41 of the prior art carrier 31, the present carrier 51 employs a pair of thin, flat quartz end plates 53 to support the ends of rods 35. Preferably, the thickness of end plates 53 should be no greater than the space on-center between the adjacent grooves 37 slots 39. If necessary, they may be thicker, but under no circumstances need they take up the actual or relative space occupied by the rods 41 and tubes 43 of prior art carriers 31.

The end portions 55 of end plates 53 extend laterally outwardly of rods 35 and serve as attachment points for at least one carrier support member 57.

Carrier support member 57 may take a variety of forms. In the embodiment illustrated in FIG. 3, it is shown as an elongated channel having a generally inverted "U"-shaped cross section. Alternative, it may take the form of a straight, solid rod or any other convenient configuration (none shown).

As with the typical prior art carrier 31, carrier 51 is provided with a tool 63 adapted to be side-mounted to carrier 51. Tool 63 is formed with a handle 47 having a pair of arms 65 having mounted at their ends a transversely deployed first carrier engaging member 67 adapted to engage carrier support member 57 and support the weight of carrier 51.

Preferably positioned, intermediate handle 47 and first carrier engaging member 67, a second, generally transversely oriented carrier engaging member 69 is securely mounted to arms 65 of tool 63. The ends of second carrier engaging member 69 extend laterally outwardly of arms 65 for engagement with end portions 55 of end plates 53. As most clearly seen in FIG. 5, with fist carrier engaging member 67 seated in the channel of carrier support member 57, second carrier engaging member 69 is positioned by arms 65 to abut end portions 55 of end plates 53 in rotation-limiting contact, thereby preventing carrier 51 from rotating with respect to carrier support member 57. By virtue of the cooperative interaction of the first and second carrier engaging members 67, 69 and carrier support member 57 and end portions 55 of end plates 53, tool 63 affords the technician full random access to, and the ability to lift and manipulate, any of the carriers in a string of such carriers on a paddle 15, or an individual carrier 51 awaiting removal from an automated transfer device (not shown).

In operation with a carrier in the form shown in FIG. 3, the tool 63 is grasped by means of handle 47 and first carrier engaging member 67 inserted edgewise into the channel of carrier support member 57. Lowering handle 47 to rotate tool 63 within carrier support member 57 brings second carrier engaging member 69 in contact with end portions 55 of end plates 53. Unable to rotate any further, tool 63 is effectively locked to carrier 51, whereby the technician is able to lift and manipulate carrier 51 at will.

It will be understood that if in place of the inverted "U"-shaped shown in FIG. 3, carrier support member 57 takes the form of a straight, solid rod 57' in FIG. 6, first carrier engaging member 67 of FIG. 5 could be the generally upright "U"-shaped channel 67' of FIG. 6 adapted to receive support member 57' to support the weight of carrier 51 with its load of wafers. As in the construction illustrated in the drawings, slight downward rotation of handle 47 would bring the end portions of second carrier engaging member 69 into rotation-limiting contact with end portions 55 of end plates 53. In this manner, the technician would have precisely the same control over carrier 51 as described in connection with the form of the assembly illustrated in FIG. 3.

The utility and advantages afforded by my invention will be readily apparent from the foregoing disclosure. It should be understood, however, that although the invention has been disclosed in terms of the specific constructions shown in the drawings and described in the text, it is not to be construed as limited to those embodiments. They are to be regarded as illustrative rather than restrictive. This specification is intended to encompass any and all variations, alternative forms, and equivalents of the examples chosen for purposes of the disclosure, which do not depart from the spirit and scope of the invention as it is defined by the following claims.

What is claimed is:

1. A side lifting semiconductor wafer carrier assembly adapted for detachable, mutual engagement along the length of a wafer carrier to lift the carrier from a carrier supporting surface, said assembly comprising:

a carrier having a plurality of elongated wafer support members arranged in spaced, parallel relation and extending the length of the carrier, the wafer support members having a plurality of grooves for supporting a series of wafers in spaced, parallel relation perpendicular to the length of the carrier;

a pair of flat end pieces rigidly supportingly mounted to the ends of the wafer support members, said end pieces having end portions extending laterally outwardly of said wafer support members;

a carrier support member defining an inverted channel, said carrier support member extending along the length of the carrier and rigidly supportingly mounted at its ends to said end pieces; and a tool adapted for detachable lateral engagement to the carrier along the length thereof, said tool comprising a handle projecting outwardly from the side of the carrier upon engagement of the tool with the carrier, a first carrier engaging member adapted to be inserted sideway into and to bear against said carrier support member to form a lift contact joint for supporting the weight of the carrier, and a second carrier engaging member adapted to be positioned for engagement with the end portions of said end pieces thereby forming a rotation contact joint impeding rotation of the carrier about said carrier support member.

2. A side lifting semiconductor wafer carrier assembly adapted for detachable, mutual engagement along the length of a wafer carrier to lift the carrier from a carrier supporting surface, said assembly comprising:

a carrier having a plurality of elongated wafer support members arranged in spaced, parallel relation and extending the length of the carrier, the wafer support members having a plurality of grooves for supporting a series of wafers in spaced, parallel relation perpendicular to the length of he carrier, a pair of flat end pieces rigidly supportingly mounted to the ends of the wafer support members, said end pieces having end portions extending laterally outwardly of said wafer support members;

a carrier support member extending along the length of the carrier and rigidly supportingly mounted at its ends to said end pieces; and a tool adapted for detachable lateral engagement to the carrier along the length thereof, said tool comprising a handle projecting outwardly from the side of the carrier upon engagement of the tool with the carrier, a first carrier engaging member defining an upright channel and adapted to bear against said carrier support member to form a lift contact joint for supporting the weight of the carrier, said carrier support member being adapted to be received sideways by the channel, and a second carrier engaging member adapted to be positioned for engagement with the end portions of said end pieces thereby forming a rotation contact joint impeding rotation of the carrier about said carrier support member.

3. A side lifting wafer carrier assembly adapted for detachable mutual engagement to lift a carrier from a carrier supporting surface, said assembly comprising:

a carrier comprising a pair of spaced end pieces having a carrier support member defining an inverted channel, said carrier support member mounted thereto and extending transversely thereof; and a carrier engaging tool adapted for lateral engagement with the carrier along the length thereof, said tool comprising a handle projecting outwardly from the side of the carrier upon engagement of the tool with the carrier, a first carrier engaging member adapted to bear against said carrier support member to form a lift contact joint for supporting the weight of the carrier, said carrier support member being adapted for sideway insertion into the channel, and a second carrier engaging member adapted to be positioned for engagement with the end portions of said end pieces thereby forming a rotation contact joint impeding rotation of the carrier about said carrier support member.

4. A side lifting wafer carrier assembly adapted for detachable mutual engagement to lift a carrier from a carrier supporting surface, said assembly comprising:

a carrier comprising a pair of spaced end pieces having a carrier support member mounted thereto and extending transversely thereof; and a carrier engaging tool adapted for lateral engagement with the carrier along the length thereof, said tool comprising a handle projecting outwardly from the side of the carrier upon engagement of the tool with the carrier, a first carrier engaging member defining an upright channel and adapted to bear against said carrier support member to form a lift contact joint for supporting the weight of the carrier, said carrier support member being adapted for sideway insertion into the channel, and a second carrier engaging member adapted to be positioned for engagement with the end portions of said end pieces thereby forming a rotation contact joint impeding rotation of the carrier about said carrier support member.

5. A side lifting semiconductor wafer carrier assembly adapted for detachable, mutual engagement along the length of a wafer carrier to lift the carrier from a carrier supporting surface, said assembly comprising:

a carrier having a plurality of elongated wafer support members arranged in spaced, parallel relation and extending the length of the carrier, the wafer support members having a plurality of grooves for supporting a series of wafers in spaced, parallel relation perpendicular to the length of the carrier;

a pair of flat end pieces rigidly supportingly mounted to the ends of the wafer support members, said end pieces having end portions extending laterally outwardly of said wafer support members;

a carrier support member extending along the length of the carrier and rigidly supportingly mounted at its ends to said end pieces; and a tool adapted for detachable lateral engagement to the carrier along the length thereof said tool comprising a handle projecting outwardly from the side of the carrier upon engagement of the tool with the carrier, a first carrier engaging member adapted to bear against said carrier support member to form a lift contact joint for supporting the weight of the carrier, and a second carrier engaging member adapted to be positioned for engagement with the end portions of said end pieces thereby forming a rotation contact joint impeding rotation of the carrier about said carrier support member;

said carrier support member and said first carrier engaging member comprising a channel.

6. The assembly of claim 5, wherein said carrier support member is an inverted channel and said first carrier engaging member is adapted for sideways insertion into said channel.

7. The assembly of claim 5, wherein said first carrier engaging member is an upright channel, and said carrier support member is adapted to be received sideways by said channel.

8. The assembly of claim 5, wherein said second carrier engaging member comprises a rod mounted to said handle and disposed generally parallel to the length of the carrier upon engagement with the carrier, said rod having end portions extending beyond the ends of said wafer support members and being adapted for engagement with the end portions of said end pieces to form a rotation contact joint.

9. A side lifting wafer carrier assembly adapted for detachable mutual engagement to lift a carrier from a carrier supporting surface, said assembly comprising:

a carrier comprising a pair of spaced end pieces having a carrier support member mounted thereto and extending transverse thereto, said end pieces having end portions extending laterally outwardly of said carrier support member; and a carrier engaging tool adapted for lateral engagement with the carrier along the length thereof, said tool comprising a handle projecting outwardly from the side of the carrier upon engagement of the tool with the carrier, a first carrier engaging member adapted to bear against said carrier support member to form a lift contact joint for supporting the weight of the carrier, and a second carrier engaging member adapted to be positioned for engagement with the end portions of said end pieces thereby forming a rotation contact joint to impede rotation of the carrier about said carrier support member;

said carrier support member and said first carrier engaging member comprising a channel.

10. The assembly of claim 9, wherein said carrier support member is an inverted channel and said first carrier engaging member is adapted for sideways insertion into said channel.

11. The assembly of claim 9, wherein said first carrier engaging member is an upright channel, and said carrier support member is adapted to be received sideways by said channel.

12. The assembly of claim 9, wherein said second carrier engaging member comprises a rod mounted to said handle and disposed generally parallel to the length of the carrier upon engagement with the carrier, said rod having end portions extending beyond the ends of said wafer support members and being adapted for engagement with the end portions of said end pieces to form a rotation contact join impeding rotation of the carrier about said carrier support member.

* * * * *